United States Patent [19]

Oshima et al.

[11] 4,072,854
[45] Feb. 7, 1978

[54] SHEET COUNTING APPARATUS

[75] Inventors: Takeo Oshima; Takashi Kondō, both of Himeji, Japan

[73] Assignee: Glory Kogyo Kabushiki Kaisha, Hyogo, Japan

[21] Appl. No.: 703,116

[22] Filed: July 6, 1976

[30] Foreign Application Priority Data

July 30, 1975 Japan .................................. 50-92941
Aug. 1, 1975 Japan .................................. 50-93772
Aug. 5, 1975 Japan .................................. 50-94742

[51] Int. Cl.² ............................................. G06M 7/06
[52] U.S. Cl. .............................. 235/92 SB; 235/92 R; 250/223 R
[58] Field of Search ............... 235/92 SB, 98 C, 98 R; 250/223 R, 571, 224, 559

[56] References Cited

U.S. PATENT DOCUMENTS

| 3,614,419 | 10/1971 | Daughton et al. | 250/223 R |
| 3,737,666 | 6/1973 | Dutro | 235/92 SB |
| 3,930,582 | 1/1976 | Gartner et al. | 235/92 SB |

Primary Examiner—Joseph M. Thesz
Attorney, Agent, or Firm—Wenderoth, Lind & Ponack

[57] ABSTRACT

A sheet counting apparatus has first through nth sheet detectors for detecting at least one through n overlapped sheet layers formed during its sheet conveying operation, n being at least the integer 2, and a signal processing circuit for processing the outputs of the detectors to form counting pulses corresponding the number of sheet layers thus overlapped, which pulses are counted by a pulse counter, for counting the number of overlapped sheets. The apparatus further has a control circuit for causing the counter to become operable before starting the sheet conveying operation.

2 Claims, 9 Drawing Figures

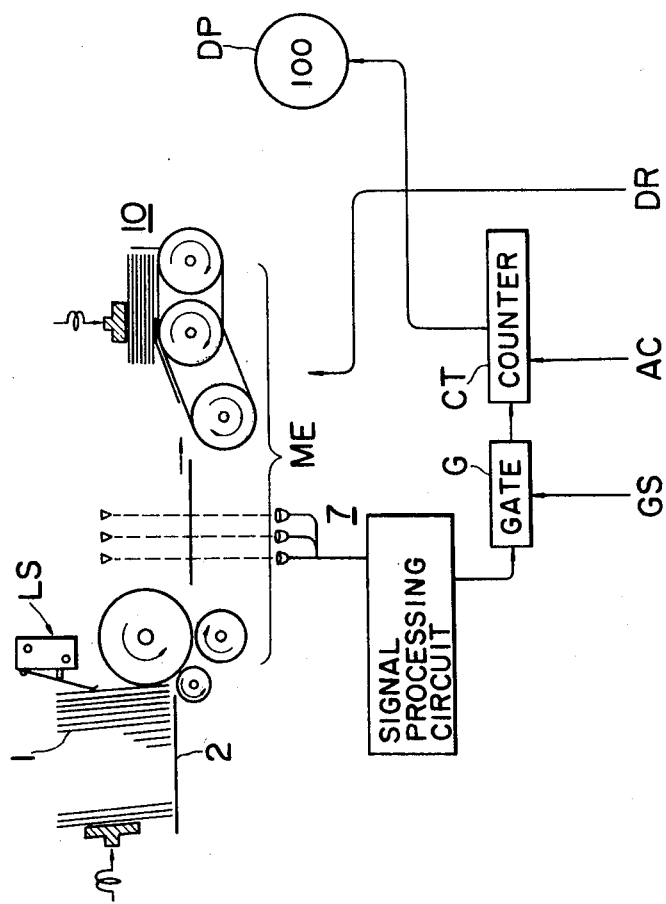

SHEET COUNTING APPARATUS

BACKGROUND OF THE INVENTION

This invention relates to sheet counting apparatuses, and more particularly to sheet counting apparatuses in which the number of sheets laid in overlapped or superimposed state during the sheet conveying operation is also positively counted.

In a conventional sheet counting apparatus, sheets loaded therein are taken out one by one and laid on a sheet conveyor in such a manner that the sheets are not overlapped one on another, that is, the sheets are spaced from each other, and are conveyed to a counter. In this operation, whenever a space between two adjacent sheets is detected, one counting pulse is produced and is counted by the counter. Therefore, if the sheets are always laid correctly in this manner, the count made by the counter will be correct. However, if the sheets taken out are overlapped, the count made by the counter will no longer be correct.

In order to solve this problem, the conventional sheet counting apparatus is provided with sheet-overlap detecting means. However, this conventional apparatus is still not fully satisfactory in that upon detection of a sheet-overlap the operation of the apparatus must be suspended to eliminate the sheet-overlap. Thus, the conventional sheet counting apparatus has a low sheet counting efficiency. Therefore, there has been a strong demand in the art to provide a sheet counting apparatus which can positively count the number of sheets even if sheets taken out are in an overlapped state.

This demand is met by the provision of a novel sheet counting apparatus according to this invention in which sheet detecting means, as described later, is employed for detecting the number of layers of overlapped sheets.

Sheets to be counted by such sheet counting apparatus are not always plain ones such as white sheets or blank sheets. That is, there is a sheet counting apparatus for counting sheets which, like bank notes, have figures or patterns and which are overlapped when taken out of the sheet container. In this case also, the number of sheets should be positively counted regardless of the figures or patterns on the sheets.

SUMMARY OF THE INVENTION

Accordingly, a primary object of this invention is to provide a sheet counting apparatus in which sheets are positively counted without stopping the apparatus even if sheets are overlapped during the sheet conveying operation.

Another object of the invention is to provide a sheet counting apparatus which can continuously count sheets having figures or patterns even if such sheets are overlapped during the sheet conveying operation.

A further object of the invention is to provide a sheet counting apparatus which has improved in reliability and accuracy.

The novel features which are considered characteristic of this invention are set forth in the appended claims. This invention itself, however, as well as other objects and advantages thereof will be best understood by reference to the following detailed description of illustrative embodiments thereof, when read in conjunction with the accompanying drawings, in which like parts are designated by like reference characters.

BRIEF DESCRIPTION OF THE DRAWINGS

In the accompanying drawings:

FIG. 7 is an explanatory diagram illustrating the schematic arrangement of a third example of the sheet counting apparatus according to the invention.

DETAILED DESCRIPTION OF THE INVENTION

When sheets are partly overlapped, they have first portions each in the form of a single sheet layer where overlapping is not present, and second portions in the form of plural sheet layers where overlapping is present. For convenience in describing this invention, the first portion will be referred to as a "one sheet layer", and the second portion will be referred to as "two sheet layers", "three sheet layers", and so forth depending on the numbers of sheets overlapped one on another and forming sheet layers.

Figure 1:
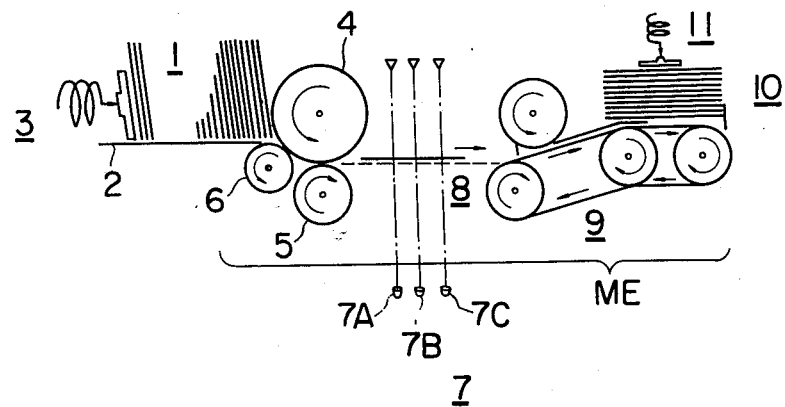
FIG. 1 is an explanatory diagram illustrating the schematic arrangement of a sheet counting apparatus according to this invention.

A first example of a sheet counting apparatus according to this invention, as shown in FIG. 1, comprises: a first sheet container 2 in which sheets 1 to be counted are loaded in the form of a stack and urged laterally by means of a first sheet pressing member 3, sheet conveying rollers 4 and 5 for peeling off and conveying the sheets 1 one by one from the first sheet container 2; an auxiliary sheet conveying roller 6 which acts on each sheet in the direction opposite to that of the rollers 4 and 5 so as to promote and facilitate the sheet peeling off and conveying operation of the rollers 4 and 5; a sheet detecting section 7 provided in the sheet conveying path 8 and comprising, for instance, photoelectric elements; a sheet conveying device 9 for stacking from the bottom the sheets delivered through the sheet detecting means 7; and a second sheet pressing member 11 for pressing the sheets thus stacked in the second sheet container downwardly in the container.

Hereinafter, sheet conveying means including the rollers 4, 5 and 6 and the sheet conveying device 9 will be referred to as "the sheet conveying mechanism ME" when applicable.

Figure 2:
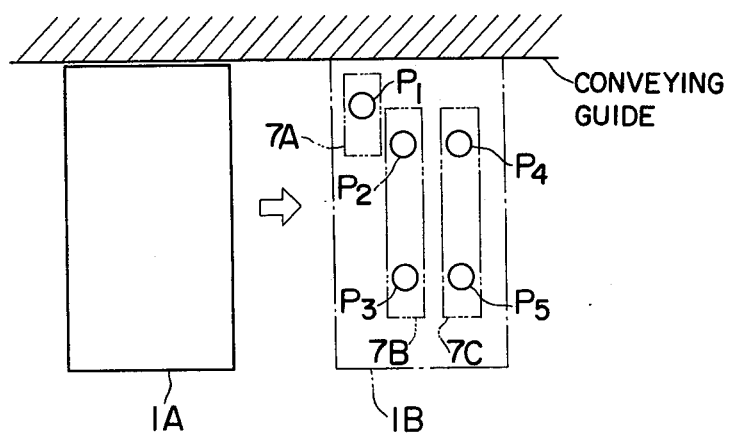
FIG. 2 is a diagram showing an arrangement of a sheet detector employed in the sheet counting apparatus of the invention.

By way of example, the sheet detecting section 7, as shown in FIG. 2, comprises a one-sheet detector 7A for detecting one or more sheet layers, a two-sheet detector 7B for detecting two or more sheet layers, and a three-sheet detector 7C for detecting three or more sheet layers. More specifically, these detectors 7A, 7B and 7C are so stationed that they are covered by a sheet 1A(1B) being conveyed and that they are swept by the sheet 1A(1B) in the stated order. The one-sheet detector 7A comprises a light receiver $P_1$, while the two-sheet detector 7B and the three-sheet detector 7C comprise two light receivers $P_2$ and $P_3$, and two light receivers $P_4$ and $P_5$, respectively.

Figure 3:
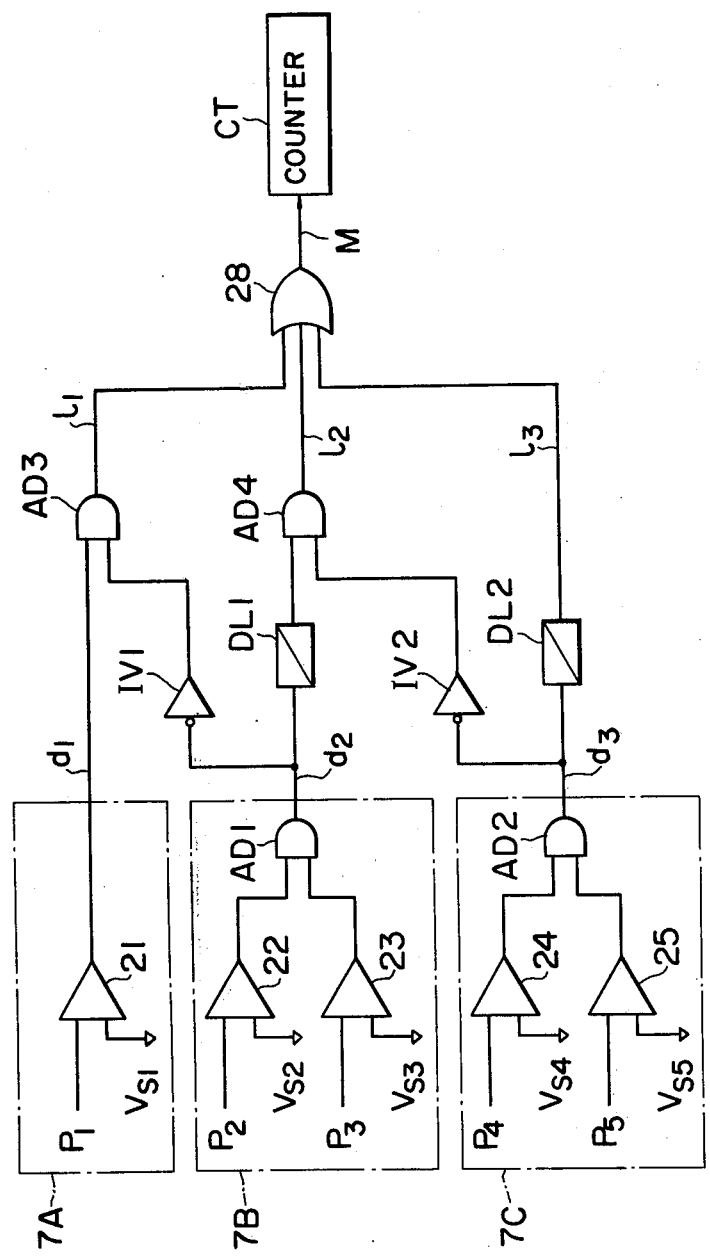
FIG. 3 is a schematic circuit diagram illustrating the circuitry of the sheet detectors and a signal processing circuit for processing the detection output signals of the sheet detectors in a first example of the sheet counting apparatus according to this invention.

As is shown in FIGS. 2 and 3, the one-sheet detector 7A comprises a light receiver $P_1$ and a voltage comparator 21 for comparing the output of the light receiver P with a reference voltage $V_{s1}$; the two-sheet detector 7B comprises light receivers $P_2$ and $P_3$ and voltage comparators 22 and 23 which compare the outputs of the light receivers $P_2$ and $P_3$ with reference voltages $V_{s2}$ and $V_{21}$, respectively; and the three-sheet detector 7C comprises light receivers $P_4$ and $P_5$ and voltage comparators 24 and 25 which operate to compare the outputs of the light receivers $P_4$ and $P_5$ with reference voltages $V_{s4}$ and $V_{s5}$, respectively.

The outputs of the detectors 7A, 7B and 7C are processed by a signal processing circuit which, as shown in FIG. 3, comprises: delay circuits $DL_1$ and $DL_2$ for delaying the outputs of AND circuits $AD_1$ and $AD_2$ connected respectively to the comparators 22 and 23 and the comparators 24 and 25 for predetermined periods of time; AND circuits $AD_3$ and $AD_4$; and an OR circuit 28, and which operates to form counting pulses, which are counted by a counter CT. The connections and functions of these circuit elements will become apparent later.

The operation of the sheet counting apparatus thus organized will be described with reference to a time chart shown in FIG. 4.

First, the operation of the apparatus in the case where sheets in overlapped state as indicated by I in FIG. 4 have been conveyed to the sheet detecting means 7 will be described. In this case, first, a one sheet layer $Ia$ of the two sheets is detected by the light receiver $P_1$, and the light receiver $P_1$ produces an output signal of a level which is, for instance, higher than that of the reference signal $V_{s1}$, and therefore the output $d_1$ of the voltage comparator 21 will have an "H" level (time instant $t_1$ in FIG. 4). At this time instant $t_1$, the output $d_2$ of the two-sheet detector 7B is at an "L" level, and therefore the output of an inverter circuit $IV_1$ connected thereto is at an "H" level. Accordingly, the output $1_1$ of the AND circuit $AD_3$ is at an "H" level, and the level of the output M of the OR circuit 28 is also at an "H" level (time instant $t_1$). Thus, the counter CT counts "1".

When the two overlapped sheets are further conveyed, two sheet layers $Ia$ thereof are detected by the light receivers $P_2$ and $P_3$, which produce output signals the levels of which are higher than those of the reference signals $V_{s2}$ and $V_{s3}$, respectively. Accordingly, each of the outputs of the voltage comparators 22 and 23 is at an "H" level, and therefore the level of the output $d_2$ of the AND circuit $AD_1$ rises to an "H" level (time instant $t_2$). Thus, the output of the inverter $I_1$ assumes an "L" level, and therefore the output of the AND circuit $AD_3$ also assumes an "L" level. The output of the delay circuit $DL_1$ will be at an "H" level for a predetermined period of time $\tau_1$ after the time instant $t_2$ when the output signal $d_2$ is at the "H" level (time instant $t_3$). In this case, the output $d_3$ of the three-sheet detector 7C remains at an "L" level so that the output of inverter $IV_2$ is at an "H" level, and therefore the output $1_2$ of the AND circuit $AD_4$ is at an "H" level, and the output M of the OR circuit 28 assumes the "H" level again (time instant $t_3$). Thus, the counter CT counts "2".

As soon as the overlapped portions $1b$ of the sheets pass through the light receivers $P_2$ and $P_3$ (time instant $t_4$), the output $d_2$ of the AND circuit $AD_1$ is changed to the "L" level, the output $1_1$ of AND circuit $AD_3$ returns to the "H" level, and, in a predetermined period of time $\tau_2$ after the time instant $t_4$, the output of the delay circuit 26 will drop to an "L" level. Finally, when the overlapped sheets have passed through the detector $P_1$ (time instant $t_5$), the output $d_1$ of the one-sheet detector 7A is changed to the "L" level.

Thus, counting the number of the overlapped sheets ("2" in this case) by the counter has been completed and the number thus obtained is equal to the number of the sheets which have been conveyed through the sheet conveying path 8 into the second sheet container 10. In the example of the operation described above, the output $d_3$ of the three-sheet detector 7C will never reach an "H" level because at no time are there three overlapped sheet layers.

Figure 4:
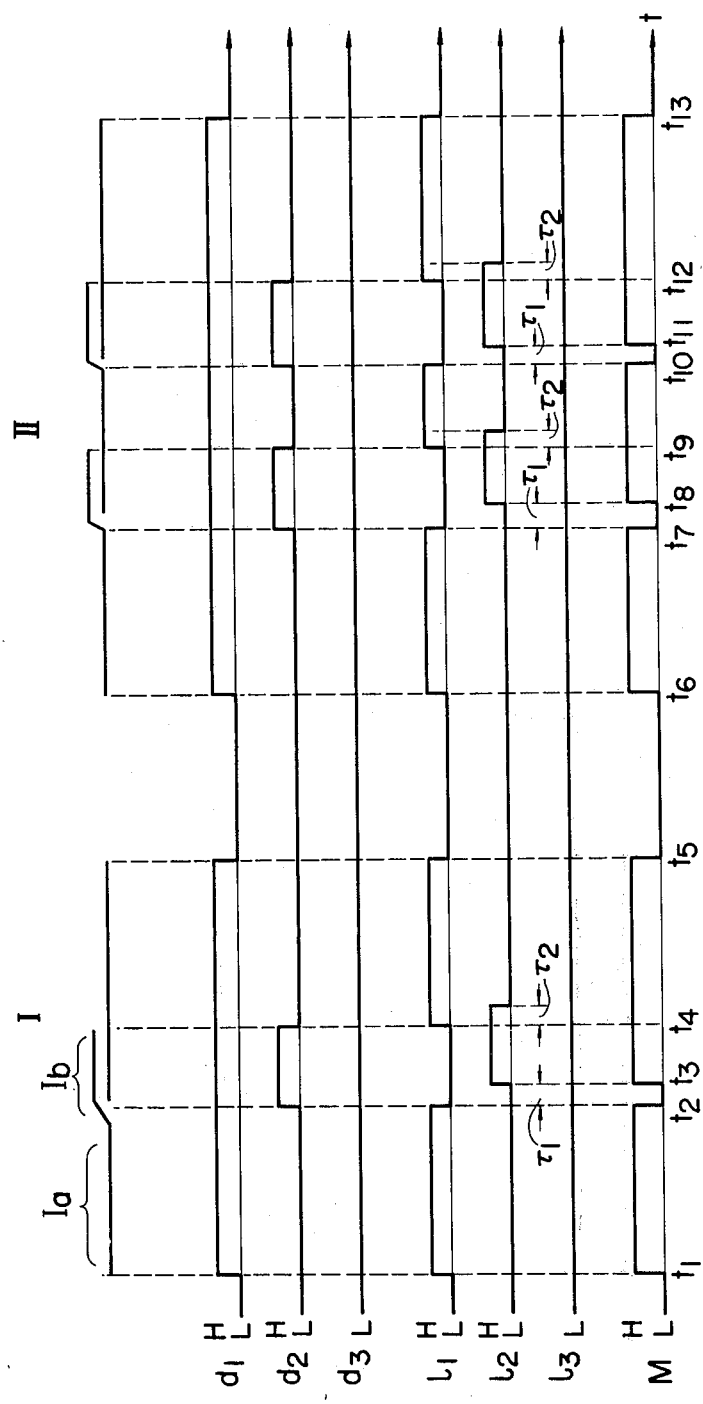
FIG. 4 is a time chart for describing the operation of the first example of the invention.

The operation of the apparatus in the case where sheets overlapped as indicated by II in FIG. 4 are conveyed will be described.

Similarly as in the case described above, at the time instant $t_6$, or when the output $d_1$ of the one-sheet detector 7A is at the "H" level, the counter CT counts "1"; and at the time instant $t_8$, that is, in the period of time $\tau_1$ from the time instant $t_7$ when the output $d_2$ of the two-sheet detector 7B is at the "H" level, the counter CT counts "2". Then, at the time instant $t_{11}$, that is, in the period of time $\tau_1$ from the time instant $t_{10}$ when the output $d_2$ of the two-sheet detector 7B is at the "H" level again by detecting the succeeding overlap, the content of the counter becomes "3".

The cases where two sheets form one overlap have been described. However, it will be obvious that the technical concept described above can be applied to the case where three sheets are overlapped. In the latter case, the content of the counter CT becomes "1", "2" and "3" in response to the operations of the one-, two-, and three-sheet detectors 7A, 7B and 7C, respectively.

As is apparent from the above description, even if sheets are overlapped, the number of the overlapped sheets can be positively counted with the aid of pulses which, according to the invention, are produced in correspondence to the number of the overlapped sheets. It should be noted that, for the formation of the pulses, the delay circuits are employed in such a manner that the counting pulses are provided in the predetermined period of time. The use of two light receivers in a sheet detector prevents erroneous detection of sheets due to noise signals, which contributes to the positive counting of the sheets.

As was described before, sheets are not always plain sheets such as white sheets or blank sheets. Some sheets such as bank notes have figures or patterns. A second example of the sheet counting apparatus according to the invention is applicable to the case where such sheets are overlapped.

Figure 5:
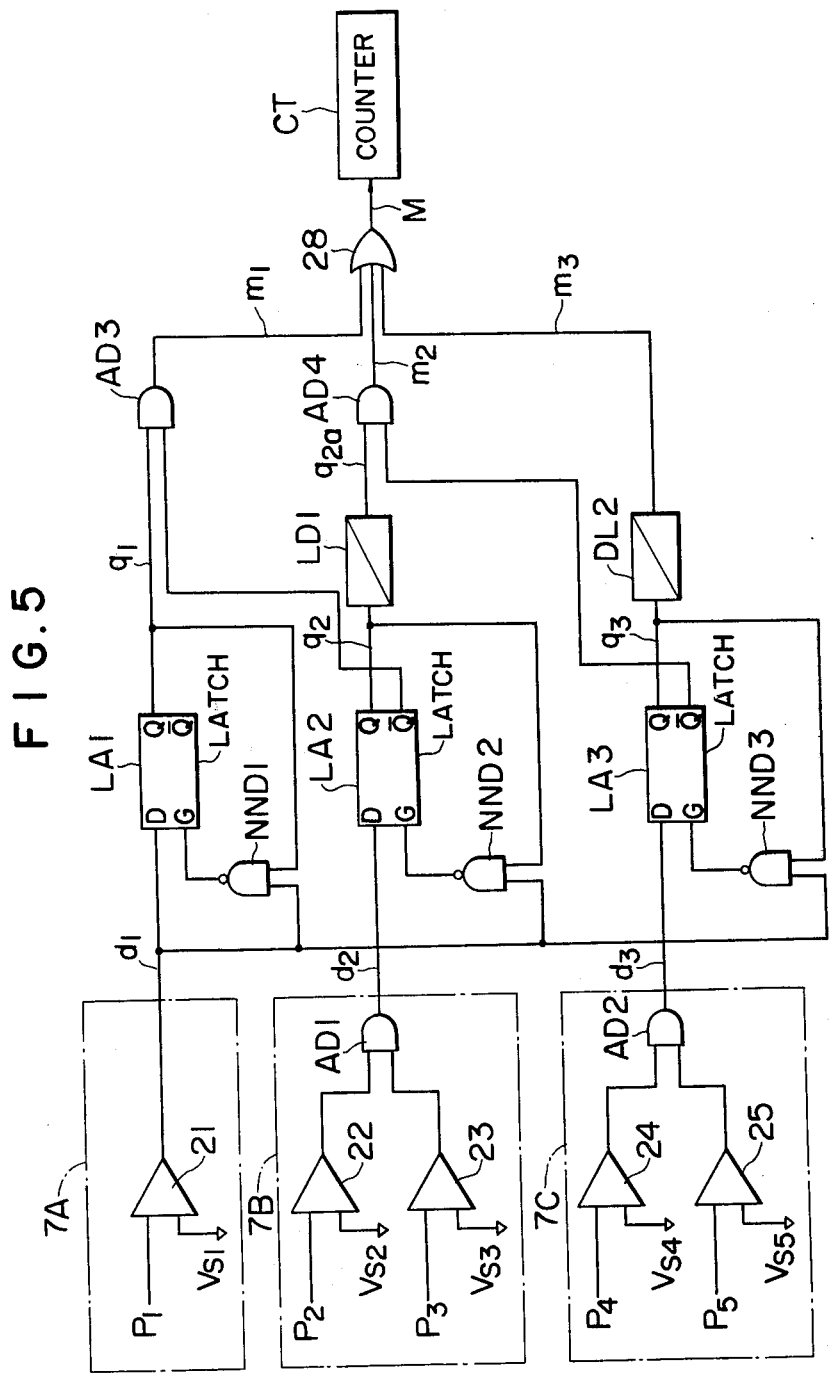
FIG. 5 is a schematic circuit diagram illustrating the circuitry of sheet detectors and a signal processing circuit for processing the detection output signal of the sheet detectors in a second example of the sheet counting apparatus according to the invention.

The construction and operation of this second examle up to its sheet detecting section are similar to those of the first example, and the output signals of the sheet detection section are processed by a signal processing circuit as shown in FIG. 5, which comprises: delay circuits $DL_1$ and $DL_2$ for delaying outputs $q_2$ and $q_3$ of the latch circuits $LA_2$ and $LA_3$ for predetermined time periods and applying them to an AND circuit $AD_4$ and an OR circuit 28 to form counting pulses which are counted by a counter CT.

It should be noted that when, in each of the latch circuits $LA_1$-$LA_3$, its "G" terminal is at an "H" level, a logic signal applied to its "D" terminal is produced, as it is, at its "Q" terminal. That is, the latch circuits have a truth table as indicated below:

| G | H | H |
|---|---|---|
| D | H | L |
| Q | H | L |
| $\overline{Q}$ | L | H |

Furthermore, when the "G" terminal is at an "L" level, the outputs at the "Q" terminal and the "$\overline{Q}$" terminal are maintained as they are, regardless of the logic signals applied to the "D" terminal. That is, when the level of the "G" terminal is changed to the "L" level from the "H" level, the output levels of the "Q" and "$\overline{Q}$" terminals are maintained unchanged until the level of the "G" terminal rises to the "H" level again, even if the level of the "D" terminal is changed to the "H" level or the "L" level.

The operation of the sheet counting apparatus thus organized will be described with reference to the time chart indicated in FIG. 6.

For the period of time when the sheet counting apparatus is in the standing-by state, or before the time instant $t_1$, all of the detection signals $d_1$-$d_3$ of the sheet detectors 7A-7B are at "L" levels, and accordingly the output levels of NAND circuits $NND_1$, $NND_2$ and $NND_3$ (or the "G" terminals of the latch circuits $LA_1$, $LA_2$ and $LA_3$) are at "H" levels. Accordingly, the outputs of the "Q" terminals of the latch circuits are at "L" levels which are the same as the levels of the detection signals $d_1$, $d_2$ and $d_3$.

Figure 6:
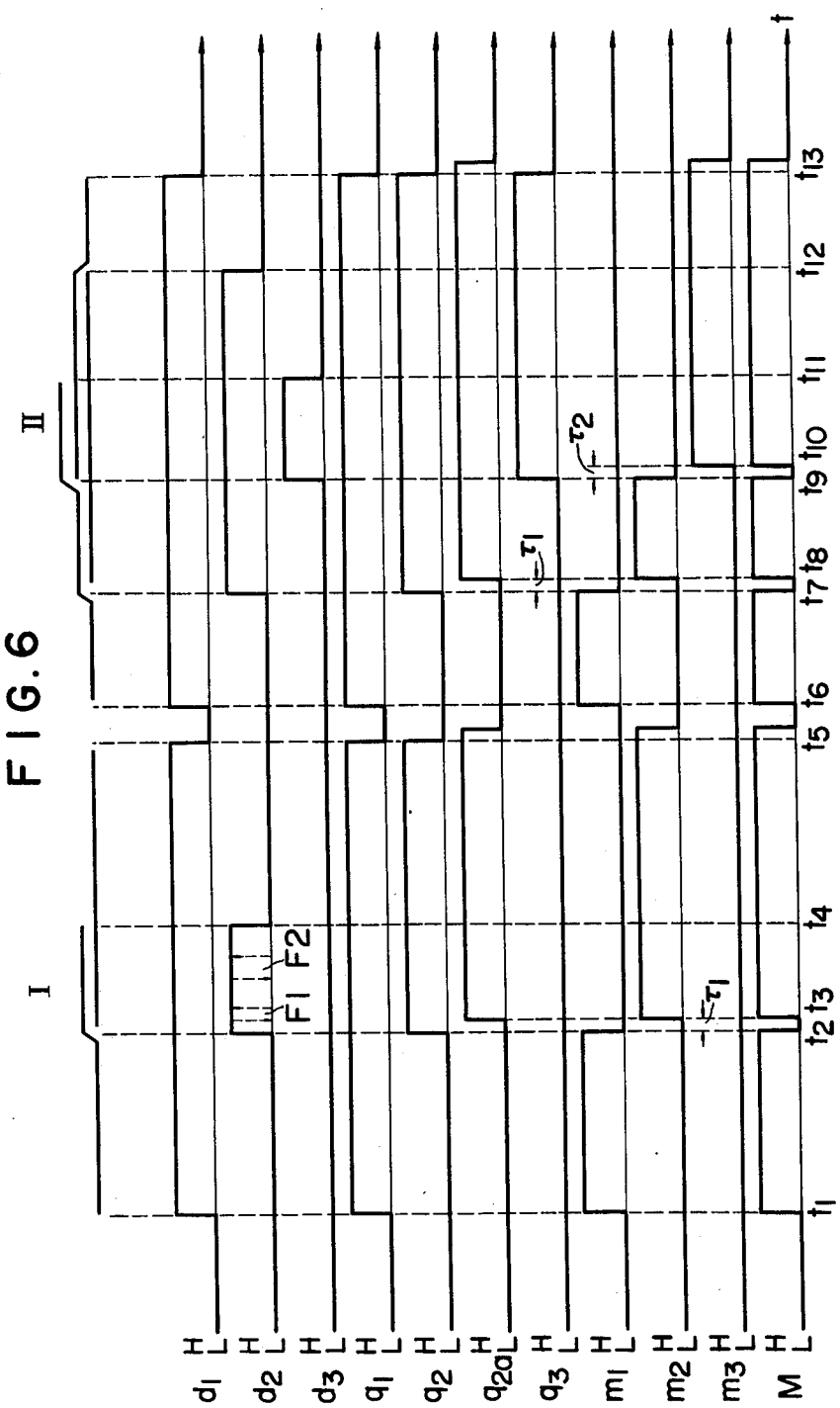
FIG. 6 is a time chart for describing the operation of the second example of the invention.

It is assumed that with the circuit in this condition sheets overlapped as indicated by "I" of FIG. 6 are conveyed to the sheet detecting section 7. One sheet layer of the sheets is detected by the light receiver $P_1$ of the one-sheet detector 7A, and the light receiver $P_1$ produces an output signal the level which is, for instance, higher than that of the reference voltage $V_{s1}$, as a result of which the output $d_1$ of the voltage comparator 21 rises to an "H" level (time instant $t_1$). This output $d_1$ at the "H" level is applied to the "D" terminal of the latch circuit $LA_1$, and therefore the output of the "Q" terminal rises to an "H" level at the time instant $t_1$. Thus, the two inputs to the NAND circuit $NND_1$ are changed to "H" levels, and therefore the output thereof is also changed to an "L" level. Accordingly, thereafter the "Q" output of the latch circuit $LA_1$ is maintained at the "H" level.

At the time instant $t_1$, both the output $d_2$ of the two-sheet detector 7B and the output $d_3$ of the three-sheet detector 7C are at the "L" levels, and the "$\overline{Q}$" output of the latch circuit $LA_2$ is at an "H" level. Accordingly, the output $m_1$ of the AND circuit $AD_3$ is at an "H" level, and the output M of the OR circuit 28 is also at an "H" level. (at the time instant $t_1$). Thus, the counter CT counts "1".

When the overlapped sheets are further conveyed along the sheet conveying path, the two sheet layers are detected by the light receivers $P_2$ and $P_3$ of the two-sheet detector, and the light receivers $P_2$ and $P_3$ produce output signals whose levels of which are higher than those of the reference signals $V_{s2}$ and $V_{s3}$, respectively.

As a result, both of the outputs of the voltage comparators 22 and 23 are at "H" levels, and the output $d_2$ of the AND circuit $AD_1$ is also at an "H" level (time instant $t_2$).

In this case, the output of the NAND circuit $NND_2$ is at the "H" level. Therefore, the output $d_2$ at the "H" level (of the AND circuit $AD_1$) applied to the "D" terminal of the latch circuit $LA_2$ is produced, as it is, at the "Q" output of the batch circuit $LA_2$ (at the time instant $t_2$). Thus, similarly as in the case of the NAND circuit $NND_1$, the two inputs to the NAND circuit $NND_2$ rise to "H" level, and the output of the NAND circuit $ND_2$ falls to an "L" level. Accordingly, thereafter the output $q_2$ of the "Q" terminal of the latch circuit $LA_2$ is maintained at an "H" level, while the output of the "$\overline{Q}$" terminal thereof is changed to an "L" level. Thus, the output level $m_1$ of the AND circuit $AD_3$ assumes an "L" level at the time instant $t_2$.

The output $q_2$ at the "Q" terminal of the latch circuit $LA_2$ is applied to the AND circuit $AD_4$, after being delayed by the delay circuit $DL_1$ for a predetermined period of time $\tau_1$ (at the time instant $t_3$). At the time instant $t_3$, the output $d_3$ of the three-sheet detector 7C is at the "L" level, and therefore the output at the "$\overline{Q}$" terminal of the latch circuit $LA_3$ is at an "H" level. Thus, the output $m_2$ of the AND circuit $AD_4$ is at an "H" level, and the OR circuit 28 also produces an output at the "H" level (at the time instant $t_3$). As a result, the counter CT counts "2".

When the two sheet layers of the sheets have passed through the light receivers $P_2$ and $P_3$, the detection signal $d_2$ of the two-sheet detector 7B falls to the "L" level (at the time instant $t_4$); however, since the "G" terminal of the latch circuit $LA_2$ is maintained at the "L" level, the output $q_2$ of the "Q" terminal thereof is still maintained at the "H" level.

When all of the sheets have passed through the light receiver $P_1$ (at the time instant $t_5$), the detection signal $d_1$ of the one-sheet detector 7A falls to the "L" level. As a result, the outputs of the NAND circuits $NND_1$, $NND_2$ and $NND_3$ rise to the "H" levels again, and therefore the latching operations of the latch circuits $LA_1$, $LA_2$ and $LA_3$ are released. Accordingly, both the output $q_1$ of the latch circuit $LA_1$ and the output $q_2$ of the latch circuit $LA_2$ fall to the "L" levels.

Because the counter CT counts the number of overlapped sheets in the manner described above, the count result of the counter CT is equal to the number of sheets which have been conveyed into the second money container 10.

Since in the above example, the sheets have no three-sheet layers, the output $d_3$ of the three-sheet detector 7C will never rise to an "H" level.

Where the number of overlapped sheets to be detected is increased, it will be necessary to determine more suitably the reference signals which are applied to the voltage comparators to produce detection signals. This is applicable also to the case where portions of a pattern or the like on sheets are greatly different in light and shade from one another.

In such a case, the detection signal $d_2$ may include variations as indicated by $F_1$ and $F_2$ in FIG. 6. However, it should be noted that no output M is provided in response to the variations $F_1$ and $F_2$, because the detection signal is latched by the latch circuit according to the invention. Thus, the counter positively counts the number of the overlapped sheets.

The operation of the sheet counting apparatus (FIG. 5) in the case where sheets to be counted are overlapped as indicated by II of FIG. 6, that is, three sheets are overlapped in three layers will be described. Similarly as in the case described above, at the time instant $t_6$ when the output $d_1$ of the one-sheet detector 7A rises to the "H" level, the counter CT counts "1"; and, at the time instant $t_8$, or the predetermined time period $\tau_1$ after the time instant $t_7$ when the output $d_2$ of the two-sheet detector 7B rises to the "H" level, the content of the counter CT changes to "2" from "1".

At the time instant $t_9$, the three-sheet layers are detected by the three-sheet detector 7C, and the output $q_3$ at the "Q" terminal of the latch circiut $LA_3$ is latched at an "H" level. This output $q_3$ is delayed for a delay time $\tau_2$ by the delay circuit $DL_2$, that is, the delay circuit $DL_2$ produces an output $m_3$ at an "H" level at the time instant $t_{10}$. Thus, the content of the counter 28 changes to "3" from "2".

In the embodiment shown in FIG. 5 also, even if sheets are overlapped, the number thereof can be positively counted with the aid of counting pulses which, according to the invention, are produced in response to the number of the sheets. With respect to the formation of such pulses, the detection signals are latched by the respective latch circuits, which leads to the prevention of erroneous sheet counting operations caused by misdetecting the number of sheets. In addition the delay circuits are employed for producing the counting pulses in the predetermined periods of time, which also contributes to the positive sheet counting operation. Furthermore, in the second example, also, the use of two light receivers as a sheet detector prevents erroneous detections of sheets caused by noise signals.

The second example of the invention described above is a sheet counting apparatus which can detect up to three overlapped sheets. However, it goes without saying that a sheet counting apparatus capable of detecting overlaps of four or more sheets can be obtained with the same technical concept as that in the second example.

Furthermore, it should be noted that the invention can be applied to sheet counting apparatuses without sheet conveying paths.

A third example of the sheet counting apparatus according to this invention, as shown in FIG. 7, comprises, in addition to the same elements as those described before, a gate circuit G connected between the signal processing circuit and the counter CT, a display unit DP for displaying the count result of the counter CT, and a control system for controlling the operation of the apparatus by producing a gate signal GS, a clear signal AC, and a drive signal DR. The sheet counting apparatus further comprises a limit switch LS for detecting the presence or absence of sheets 1 in the container 2.

Figure 8A:
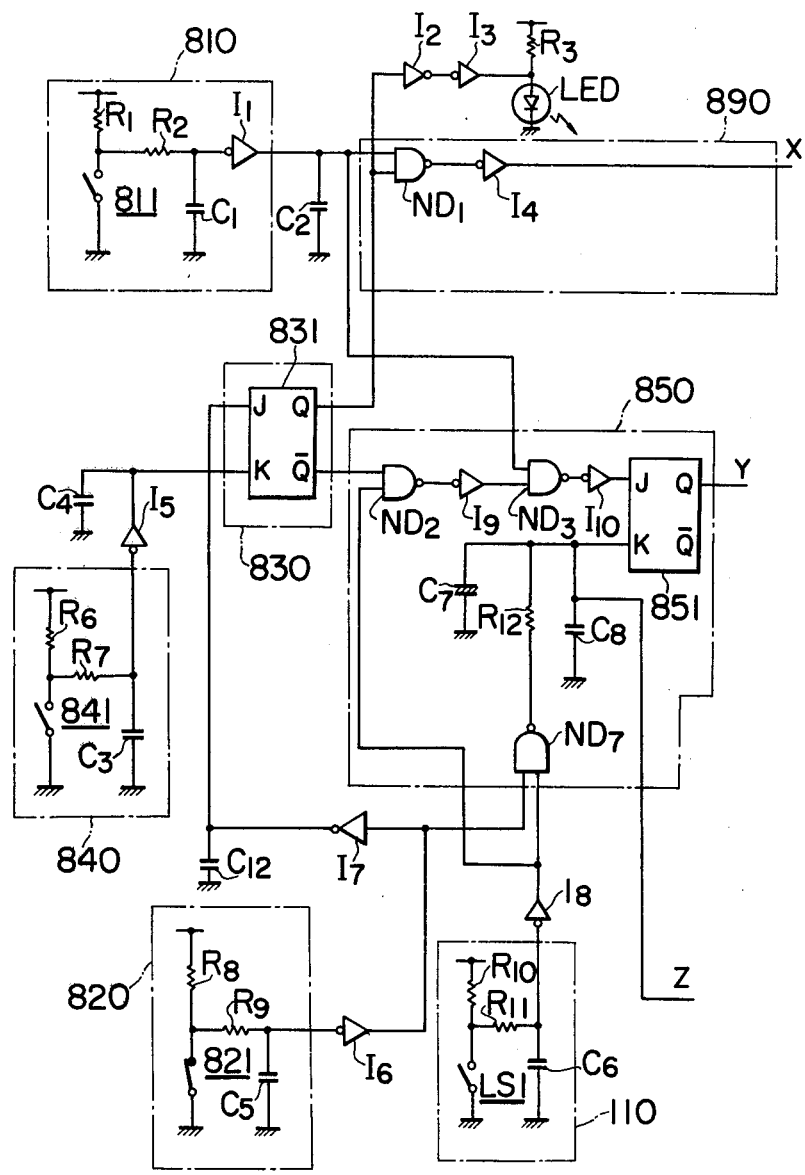
FIGS. 8A and 8B are two parts of a circuit diagram illustrating a control system employed in the sheet counting apparatus shown in FIG. 7.
Figure 8B:
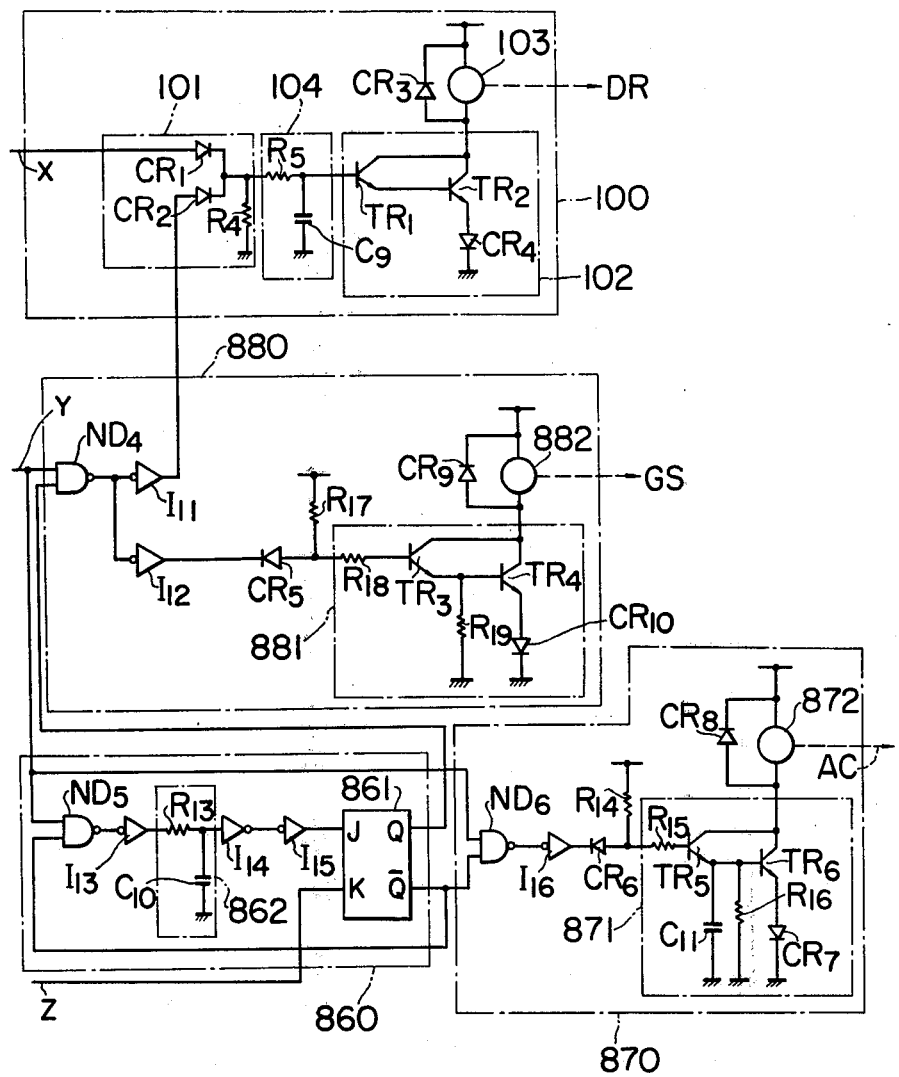

The control system, as shown in FIGS. 8a and 8b, comprises: start command generating means 810 comprising a start switch 811 for starting a sheet counting operation; count inhibition command generating means 820 for suspending or inhibiting the sheet counting operation, the means 820 comprising a manual inhibition switch 821 which when sheets are jammed, is manually operated; a first memory circuit 830 comprising a flip-flop circuit 831 operating to store a command output of the count inhibition command generating means applied thereto through inverter circuits $I_6$ and $I_7$; reset means 840 comprising a reset switch 841 operating to clear the contents of the memory circuit 830 through an inverter $I_5$; a second memory circuit 850 comprising a flip-flop circuit 851 which, when under the condition that starting of the sheet counting operation has been instructed by called for the means 810, no count inhibition command is produced by the first memory circuit 830 and a sheet presence/absence detecting means 110 (described later) detects the presence of sheets, stores a start command with the aid of NAND circuits $ND_2$ and $ND_3$ and inverter circuits $I_9$ and $I_{10}$; a third memory circuit 860 comprising a flip-flop circuit 861 which, when the memory circuit 850 stores the start command, stores the start command from the memory circuit 850 with the aid of a NAND circuit $ND_5$, other gate circuits, and a delay circuit 862 after a predetermined delay time; and an automatic clear circuit 870 in which a pulse signal is formed by a NAND circuit $ND_6$ with the aid of outputs from the memory circuits 850 and 860 to operate an amplifier circuit 871 including transistors $TR_5$ and $TR_6$, to energize a relay 772 to obtain a clear signal AC across its contacts.

The control system further comprises: a first count control circuit 880 where an amplifier 881 is operated through a NAND circuit $ND_4$ and other gate circuits with the aid of outputs of the memory circuits 850 and 860, whereby a relay 882 is energized to provide the gate signal GS across its contacts; a second count control circuit 890 which, when the start of the counting operation is called for by the start command generating means 810 and the count inhibition command is stored in the memory circuit 830, carries out only the counting operation; a drive signal generating section 100 where an amplifier 102 is operated through an OR circuit 101 with the aid of output signals of the count control circuits 880 and 890, whereby a relay 103 is energized to produce the drive signal DR across its contacts; and the sheet presence/absence detecting means 110 comprising a contact means $LS_1$ of the limit switch LS (FIG. 7) operating to detect the presence or absence of sheets 1 in the first sheet container 2, the detecting means 110 being adapted to clear the flip-flop circuit 851 in the memory circuit 850.

The operation of the sheet counting apparatus as thus constructed will be described.

Upon loading of sheets 1 in the first sheet container, the limit switch LS is operated to detect the presence of the sheets 1 therein, and the contact means $LS_1$ is placed in the "ON" condition or closed. Accordingly, the output of an inverter $I_8$ connected to the sheet presence/absence detecting means 110 rises to an "H" level, which is applied to NAND circuits $ND_7$ and $ND_2$ in the memory circuit 850.

Under this condition, if the inhibition switch 820 in the count inhibition command generating means 820 is not operated, the output of an inverter $I_6$ connected to the inputting means 820 is at an "H" level. Thus, if the reset switch 841 of the reset means 840 is not operated or kept off, the Q output of the flip-flop circuit 831 is at an "L" level, and the anode of a light emission diode LED is at an "L" level through inverters $I_2$ and $I_3$ connected between the flip-flop circuit 830 and the diode LED, as a result of which no light is emitted by the diode LED. On the other hand, the output of the NAND circuit $ND_2$ is at an "L" level, and the output of the inverter $I_9$ connected to the NAND circuit $ND_2$ therefore is at an "H" level.

Under this condition, if an operator turns on the start switch 811 in the start command generating means 810, the output of an inverter $I_1$ in the inputting means 810 rises to an "H" level. As a result, the output of the NAND circuit ND₃ in the memory circuit 80 assumes an "L" level, and the Q output of the flip-flop circuit 851 therefore rises to an "H" level.

At this time, the $\overline{Q}$ output of the flip-flop circuit 861 is at an "H" level, and therefore the output of a NAND circuit ND₅ in the memory circuit 860 and the output of a NAND circuit ND₆ in the automatic clear circuit 870 are at "L" levels. This output of the NAND circuit ND₅ is applied through an inverter I₁₃, a delay circuit 862 constituted by a resistor R₁₃ and a capacitor C₁₀ and through inverters I₁₄ and I₁₅ to the flip-flop circuit 861 with a predetermined delay time to invert the state of the latter 861, that is, to invert the $\overline{Q}$ output level and the Q output level to "L" and "H" levels, respectively.

On the other hand, the above-described output at the "L" level of the NAND circuit ND₆ energizes the relay 872 through an inverter I₁₆, a diode CR₆ and the amplifier 871, whereby the clear signal AC is produced. The production of the clear signal AC is continued until the state of the flip-flop circuit 861 is inverted. This clear signal AC clears the contents of the counter CT, or sets the count value thereof to "0", thereby to allow the counter to be ready for the present sheet counting operation.

As was previously described, upon inversion of the state of the flip-flop circuit 861, the Q output rises to the "H" level, while the $\overline{Q}$ output falls to the "L" level. Therefore, the output of an inverter I₁₂ in the first count control circuit 880 rises to an "H" level, and the amplifier 881 is operated to energize the relay 882. As a result, the gate signal GS is produced to open the gate means G connected to the counter CT. Thus, the counter CT becomes operable for counting the sheets. Hereinafter, this state of the counter CT will be referred to as "an operable state" when applicable.

On the other hand, as the output of the NAND circuit ND₄ is at the "L" level, the output of an inverter I₁₁ connected thereto rises to an "H" level. This output of the inverter I₁₁ is applied through a diode CR₂ of the OR circuit 101 to a delay circuit 104 constituted by a resistor R₅ and a capacitor C₉, whereby the amplifier 102 is operated with a predetermined delay time to energize the relay 103, and the drive signal DR is produced.

The drive signal DR thus produced drives the sheet conveying mechanism ME so that the sheets 1 are taken out of the first sheet container 2 one by one by the rollers 4, 5 and 6 and conveyed through the sheet conveying path 8 to the second sheet container 10.

In this connection, it should be noted that the sheet conveying mechanism ME is driven after an internal corresponding to the predetermined delay time after the counter CT is brought into its operable state as described above, and therefore all of the sheets conveyed along the sheet conveying path 8 will be positively counted by the counter CT.

The number of sheets 1 counted by the counter CT is displayed by the display unit DP.

When all of the sheets 1 loaded in the first sheet container 2 have been thus conveyed and counted, the contact means LS₁ of the limit switch LS is turned off because no sheets 1 are left in the first sheet container 2. Accordingly, the output of the inverter I₈ falls to an "L" level, and the output of the NAND circuit ND₇ rises to an "H" level. As a result, the state of the flip-flop circuit 851 is inverted, that is, its Q output assumes an "L" level. Thus, the output of the NAND circuit ND₄ rises to an "H" level, and the outputs of the inverters I₁₁ and I₁₂ fall to "1" levels. Therefore, the relays 882 and 103 are deenergized, so that the sheet counting operation is suspended. In addition, in concert with this operation, the start command stored in the third memory circuit 860 is cleared.

In the manner described above, the sheet counting apparaus performs the sheet counting operation.

Now, when the inhibition switch 821 of the count inhibition command generating means 820 is operated, or turned off, the output of the means 820 is applied to the flip-flop circuit 831 through the inverters I₆ and I₇ so as to invert the state of the flip-flop circuit 831, that is, to raise its Q output to an "H" level. With the aid of this Q output at the "H" level, the light emission diode LED emits light.

Under this condition, if the start switch 811 is operated, the output of a NAND circuit ND₁ in the second count control circuit 890 will assume an "L" level, and therefore an inverter I₄ connected to the NAND circuit ND₁ will assume an "H" level. Since this output at the "H" level is applied to the amplifier 102 through the diode CR₁ of tne OR circuit 101 and the delay circuit 104, the relay 103 is energized to provide the drive signal DR. With the aid of this drive signal DR, the sheet conveying mechanism ME is driven.

In this operation, however, since the $\overline{Q}$ output of the flip-flop circuit 831 is at the "L" level, the NAND circuit ND₃ is locked, and the state of the flip-flop circuit 851 is not inverted. Therefore, the count control circuit 880 becomes inoperable, that is, in this case no gate signal GS is produced while the sheet conveying mechanism ME is operated. Accordingly, even if trouble such as jamming of sheets occurs, erroneous counting of the number of sheets by the counter can be prevented.

When the reset switch 841 is operated after such trouble has been corrected, the state of the flip-flop circuit 831 is inverted through the inverter I₅, and therefore the count inhibition command stored in the memory circuit 830 is cleared. Accordingly, the sheet counting operation can be continued as described before.

Thus, the reliability and accuracy of the sheet counting operation of the sheet counting apparatus is greatly improved in its reliability.

What is claimed is:
1. A sheet counting apparatus wherein sheets loaded therein are successively separated and conveyed and the number of conveyed sheets is counted, which apparatus comprises:
 (a) a plurality of sheet passage detecting means positioned along the path along which said sheets are conveyed for respectively producing detecting signals having levels corresponding to different numbers of thicknesses of sheets being conveyed;
 (b) a plurality of sheet number detecting means coupled to the respective sheet passage detecting means for comparing the level of the detection signals from the respective sheet passage detecting means with respective reference signals having predetermined levels for detecting whether a number of sheets from one through n overlapped sheets are being conveyed past said sheet passage detecting means and each producing an outpt when the comparison indicates the passage of the corresponding number of sheets, n being at least the integer 2;
 (c) a pulse forming circuit means coupled to said plurality of sheet number detecting means for forming a number of pulses equal to the number of outputs from said sheet detecting means; and (d) pulse counting means coupled to said pulse forming circuit means for counting the number of pulses from said pulse forming means, whereby even when the sheets are overlapped when they are being conveyed, pulses are formed corresponding to the number of the overlapped sheets to correctly count all of the sheets which are conveyed.

2. A sheet counting apparatus wherein sheets loaded therein are successively separated and conveyed and the number of conveyed sheets is counted, which apparatus comprises:

(a) a plurality of sheet passage detecting means positioned along the path along which said sheets are conveyed for respectively producing detecting signals having levels corresponding to different numbers of thicknesses of sheets being conveyed;

(b) a plurality of sheet number detecting means coupled to the respective sheet passage detecting means for comparing the level of the detection signals from the respective sheet passage detecting means with respective reference signals having predetermined levels for detecting whether a number of sheets from one through $n$ overlapped sheets are being conveyed past said sheet passage detecting means and each producing an output signal when the comparison indicates the passage of the corresponding number of sheets, $n$ being at least the integer 2;

(c) a plurality of $n$ signal latching circuit means connected to the respective sheet number detecting means for latching said first through $n$th output signals from the respective sheet number detecting means;

(d) a plurality of $n$ collating means each connected between said first sheet number detecting means and respective $n$ signal latching circuit means for obtaining the logical products of the output signal of said first sheet number detecting means and the output signals of the respective $n$ signal latching circuit means, the outputs of the respective collating means being connected to control inputs of the corresponding signal latching circuit means to apply the logical products to the corresponding latching circuit means for the control thereof; and (e) pulse signal forming circuit means connected to said signal latching circuit means for forming pulse signals from the outputs of said signal latching means, whereby all of the sheets can be correctly counted by counting the pulse signals from said pulse signal forming circuit means.

* * * * *